United States Patent
Denda

(10) Patent No.: US 10,219,369 B2
(45) Date of Patent: Feb. 26, 2019

(54) CIRCUIT BOARD

(71) Applicant: SHINKO ELECTRIC INDUSTRIES CO., LTD., Nagano-shi, Nagano (JP)

(72) Inventor: Tatsuaki Denda, Nagano (JP)

(73) Assignee: SHINKO ELECTRIC INDUSTRIES CO., LTD., Nagano-Shi (JP)

(*) Notice: Subject to any disclaimer, the term of this patent is extended or adjusted under 35 U.S.C. 154(b) by 0 days.

(21) Appl. No.: 15/627,537

(22) Filed: Jun. 20, 2017

(65) Prior Publication Data

US 2017/0374732 A1 Dec. 28, 2017

(30) Foreign Application Priority Data

Jun. 24, 2016 (JP) .................. 2016-125465

(51) Int. Cl.
H05K 1/02 (2006.01)
H05K 1/11 (2006.01)
H05K 1/14 (2006.01)
H05K 3/42 (2006.01)
H05K 3/46 (2006.01)
H05K 3/36 (2006.01)
H05K 1/18 (2006.01)
H05K 3/06 (2006.01)
H05K 3/00 (2006.01)

(52) U.S. Cl.
CPC ............ H05K 1/028 (2013.01); H05K 1/115 (2013.01); H05K 1/147 (2013.01); H05K 3/361 (2013.01); H05K 3/423 (2013.01); H05K 3/429 (2013.01); H05K 3/4623 (2013.01); H05K 3/4691 (2013.01); H05K 1/118 (2013.01); H05K 1/189 (2013.01); H05K 3/0064 (2013.01); H05K 3/06 (2013.01); H05K 3/4644 (2013.01); H05K 2201/068 (2013.01)

(58) Field of Classification Search
CPC ...... H05K 1/028; H05K 3/4623; H05K 1/115; H05K 3/423; H05K 3/4644; H05K 2201/068; H05K 3/06
See application file for complete search history.

(56) References Cited

U.S. PATENT DOCUMENTS 5,260,518 A * 11/1993 Tanaka ............... H01L 21/4853
                                                                174/255
5,854,534 A * 12/1998 Beilin ................ H01L 21/486
                                                                257/691
7,378,596 B2 * 5/2008 Kawaguchi .......... H05K 3/4691
                                                                174/255

(Continued)

FOREIGN PATENT DOCUMENTS

JP          8-139455          5/1996
JP          2003-332743       11/2003

Primary Examiner — Ishwarbhai B Patel
(74) Attorney, Agent, or Firm — Rankin, Hill & Clark LLP

(57) ABSTRACT

A circuit board includes a rigid board including a first wiring layer formed on its upper surface side, and a flexible board including a base material having flexibility and disposed on an upper surface side of the first wiring layer, a second wiring layer formed on the base material, and a via wiring formed in a through-hole passing through the second wiring layer and the base material. The via wiring has a protrusion protruding from an upper surface of the second wiring layer, and extending on the upper surface of the second wiring layer positioned on an outer circumferential side of the through-hole.

7 Claims, 10 Drawing Sheets

(56) References Cited

U.S. PATENT DOCUMENTS

| | | | |
|---|---|---|---|
| 8,383,956 B2* | 2/2013 | Nakai | C25D 5/02 |
| | | | 174/250 |
| 9,374,898 B2* | 6/2016 | Sung | H05K 1/118 |
| 2004/0118603 A1* | 6/2004 | Chambers | G01R 1/0735 |
| | | | 174/261 |
| 2011/0084383 A1* | 4/2011 | Mizutani | H05K 1/147 |
| | | | 257/737 |

* cited by examiner

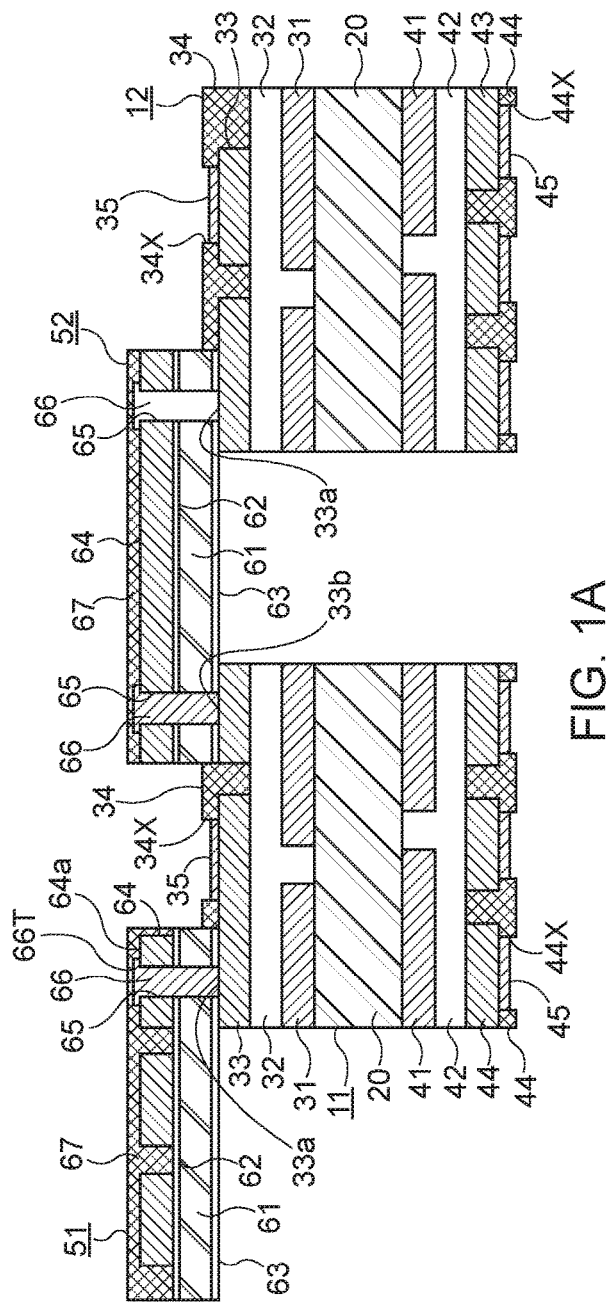
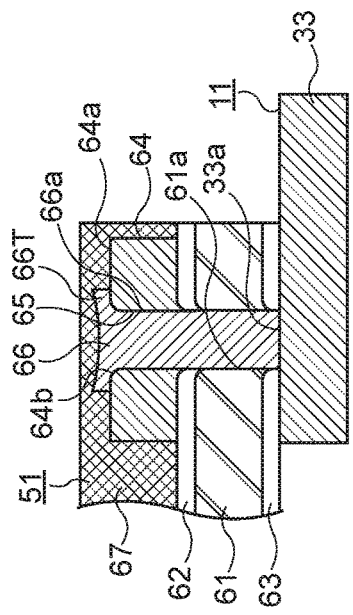
FIG. 1A
FIG. 1B

CIRCUIT BOARD

CROSS-REFERENCE TO RELATED APPLICATION

The present application claims priority from Japanese Patent Application No. 2016-125465 filed on Jun. 24, 2016, the entire content of which is incorporated herein by reference.

BACKGROUND

Technical Field

The present invention relates to a circuit board.

Related Art

In the related art, downsizing and function improvement of electronic devices are proceeding. To this end, rigid flexible boards configured by connecting rigid boards and flexible boards to make arrangements with a high degree of freedom (for example, three-dimensional arrangements) possible have been proposed (see Japanese Patent Application Laid-Open Nos. 8-139455 and 2003-332743 for instance).

[Patent Document 1] Japanese Patent Application Laid-Open No. 8-139455

[Patent Document 2] Japanese Patent Application Laid-Open No. 2003-332743

However, such a circuit board having a structure configured by connecting a rigid board and a flexible board as described above needs improvement in the reliability of the connection of both substrates.

SUMMARY

A circuit board according to an exemplary embodiment, comprises:

a rigid board including a first wiring layer formed on its upper surface side; and a flexible board including a base material having flexibility and disposed on an upper surface side of the first wiring layer, a second wiring layer formed on the base material, and a via wiring formed in a through-hole passing through the second wiring layer and the base material, wherein the via wiring has a protrusion protruding from an upper surface of the second wiring layer, and extending on the upper surface of the second wiring layer positioned on an outer circumferential side of the through-hole.

A method of manufacturing a circuit board, according to an exemplary embodiment, comprises:

forming a flexible board including a base material having flexibility, a second wiring layer formed on an upper surface of the base material, and a through-hole passing through the second wiring layer and the base material;

forming a rigid board having a metal layer on its upper surface side;

bonding the flexible board to an upper surface of the metal layer of the rigid board;

forming a via wiring in the through-hole by electrolytic plating using the metal layer as a power supply electrode, so as to protrude from an upper surface of the second wiring layer and have a protrusion extending on the upper surface of the second wiring layer; and forming a first wiring layer by patterning the metal layer.

According to an aspect of the present invention, it is possible to improve connection reliability.

BRIEF DESCRIPTION OF THE DRAWINGS

FIGS. 1A and 1B are a cross-sectional view and a partially enlarged cross-sectional view schematically illustrating a circuit board, respectively.

DETAILED DESCRIPTION

Figure 2A:
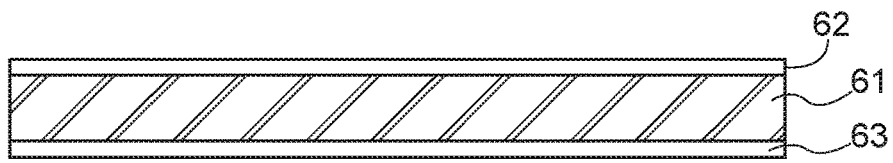
FIGS. 2A to 2E are cross-sectional views schematically illustrating a method of manufacturing a flexible board.

Hereinafter, individual embodiments will be described.

In the accompanying drawings, for the purpose of convenience, some portions to be features are shown in larger sizes in order to make the features understandable, and the dimensional proportions and the like of individual components may differ from their actual values. Also, in cross-sectional views, in order to make the cross-section structures of individual members understandable, some members are shown in a screentone pattern used as an alternative to hatching, and some members are shown without hatching.

As shown in FIG. 1A, a circuit board includes two rigid boards 11 and 12 and two flexible boards 51 and 52.

The rigid board 11 includes a core substrate 20, a wiring layer 31, an insulating layer 32, a wiring layer 33, a protective layer 34, a surface treatment layer 35, and a wiring layer 41, an insulating layer 42, a wiring layer 43, a protective layer 44, and a surface treatment layer 45.

The core substrate 20 is, for example, a so-called glass-epoxy substrate obtained by impregnating glass cloth (glass fabric) which is a reinforcement material with a thermosetting insulating resin containing an epoxy resin as its main component and curing the thermosetting insulating resin. However, the reinforcement material is not limited to glass cloth, and, for example, non-woven glass fabric, woven aramid fabric, non-woven aramid fabric, woven LCP (liquid crystal polymer) fabric, and non-woven LCP fabric can be used. Also, the thermosetting insulating resin is not limited to the epoxy resin, and various resin materials such as a polyimide and a cyanate resin can be used.

On the upper surface side of the core substrate 20, the wiring layer 31, the insulating layer 32, and the wiring layer 33 are stacked. Also, on the lower surface side of the core substrate 20, the wiring layer 41, the insulating layer 42, and the wiring layer 43 are stacked. As the materials of the insulating layers 32 and 42, insulating resins such as an epoxy resin, a polyimide resin, and an acrylic resin can be used. As the materials of the wiring layers 31, 33, 41, and 43, for example, copper (Cu) and copper alloys can be used.

Also, although not shown in the drawings, the wiring layers 31 and 41 are connected to each other by via wirings passing through the core substrate 20. Also, the wiring layers 31 and 33 are connected to each other by vias passing through the insulating layer 32. Similarly, the wiring layers 41 and 43 are connected to each other by vias passing through the insulating layer 42.

The insulating layer 32 and the wiring layer 33 are covered by the protective layer 34. The protective layer 34 has openings 34X exposing some portions of the wiring layer 33. As the material of the protective layer 34, a photosensitive epoxy-based insulating resin, an insulating acrylic resin, and so on can be used. Both end portions of the wiring layer 33 are exposed from the protective layer 34. Both exposed end portions of the wiring layer 33 function as connection portions 33a and 33b.

On the portions of the upper surface of the wiring layer 33 exposed from the openings 34X of the protective layer 34, the surface treatment layer 35 is formed. An example of the surface treatment layer 35 is a stack of a nickel (Ni) layer and a gold (Au) layer (a metal layer configured by sequentially stacking a Ni layer and an Au layer). Also, as the surface treatment layer 35, an Au layer, a stack of a Ni layer, a palladium (Pd) layer, and an Au layer, and so on can be used. As the Au layer, the Ni layer, and the Pd layer, for example, metal layers formed by electroless plating (electroless plated metal layers) can be used. Also, the Au layer is a metal layer formed of Au or an Au alloy, and the Ni layer is a metal layer formed of Ni or a Ni alloy, and the Pd layer is a metal layer formed of Pd of a Pd alloy. Alternatively, on the surface of the wiring layer 33, a surface treatment layer may be formed of an organic coating of an azole compound, an imidazole compound, or the like by performing an anti-oxidation process such as an organic solderability preservative (OSP) process.

The insulating layer 42 and the wiring layer 43 are covered by the protective layer 44. The protective layer 44 has openings 44X exposing some portions of the wiring layer 43. As the material of the protective layer 44, a photosensitive epoxy-based insulating resin, an insulating acrylic resin, and so on can be used. On the portions of the upper surface of the wiring layer 43 exposed from the openings 44X of the protective layer 44, the surface treatment layer 45 is formed. Similarly to the above-described surface treatment layer, the surface treatment layer 45 is, for example, a stack of a Ni layer and an Au layer. However, the surface treatment layer 45 may be an Au layer, a stack of a Ni layer, a palladium (Pd) layer, and an Au layer, and an organic coating formed by an OSP process.

The wiring layer 33 has the connection portions 33a and 33b, which are connected to the flexible boards 51 and 52. The rigid board 11 is connected to an end portion of the flexible board 51 (in FIGS. 1A and 1B, the right end) by the connection portion 33a. Also, the rigid board 11 is connected to an end portion of the flexible board 52 (in FIG. 1A, the left end) by the connection portion 33b.

The rigid board 12 has the same configuration as that of the rigid board 11. In other words, the rigid board 12 includes a core substrate 20, a wiring layer 31, an insulating layer 32, a wiring layer 33, a protective layer 34, a surface treatment layer 35, and a wiring layer 41, an insulating layer 42, a wiring layer 43, a protective layer 44, and a surface treatment layer 45. These components such as the wiring layer 41 have the same details as described above with respect to the rigid board 11, and thus will not be described. However, the rigid board 12 is connected to an end portion of the flexible board 52 (in FIG. 1A, the right end) by a connection portion 33a of the wiring layer 33.

The flexible board 51 includes a base material 61, adhesive layers 62 and 63, a wiring layer 64, a via wiring 66, and a protective layer 67.

The base material 61 has flexibility. As the base material 61, for example, a flexible film-like substrate formed of a resin such as a polyimide resin or a polyester resin, a liquid crystal polymer, or the like can be used. The thickness of the base material 61 can be set to, for example, 25 μm (micrometers) to 30 μm.

The adhesive layer 62 is formed on the upper surface of the base material 61, and bonds the wiring layer 64 to the base material 61. The adhesive layer 63 is formed on the lower surface of the base material 61, and bonds the base material 61 to the wiring layer 33 (the connection portion 33a) of the rigid board 11. As the materials of the adhesive layers 62 and 63, for example, adhesives such as epoxy-based adhesives and silicone-based adhesives can be used. The thickness of the adhesive layers 62 and 63 can be set to, for example, about 3 μm to 10 μm.

The wiring layer 64 is formed on the base material 61 with the adhesive layer 62 interposed therebetween, and is patterned in a desired planar shape. As the material of the wiring layer 64, for example, copper (Cu) or a copper alloy can be used. The thickness of the wiring layer 64 can be set to, for example, 10 μm to 30 μm.

The flexible board 51 has a through-hole 65 formed in one end portion (the right end). The through-hole 65 passes through the wiring layer 64, the adhesive layer 62, and the base material 61, and the adhesive layer 63. Further, the through-hole 65 exposes a portion of the upper surface of the wiring layer 33 of the rigid board 11. The through-hole 65 is formed, for example, in a circle shape as seen in a plan view. The size (diameter) of the through-hole 65 can be set to, for example, 150 μm to 500 μm.

The through-hole 65 is filled with the via wiring 66. The via wiring 66 has a protrusion 66T protruding from the upper surface 64a of the wiring layer 64 and radially extending on a portion of the upper surface of the wiring layer 64 positioned on the outer circumferential side of the upper end portion of the through-hole 65. The lower end of the via wiring 66 is joined directly with the wiring layer 33 of the rigid board 11. The wiring layer 64 of the flexible board 51 and the wiring layer 33 of the rigid board 11 are electrically connected to by the via wiring 66. As the material of the via wiring 66 (including the protrusion 66T), for example, copper or a copper alloy can be used.

The planar shape of the protrusion 66T is, for example, a circle shape. The size (diameter) of the protrusion 66T can be set to, for example, 200 μm to 600 μm. The planar shape of the protrusion 66T has a diameter larger than that of the planar shape of a portion of the via wiring 66 filled in the through-hole 65 (identical to the planar shape of the through-hole 65). The upper surface of the protrusion 66T is a concave surface having such a shape that the center side is deeper than the outer circumferential side. However, the upper surface of the protrusion 66T can be, for example, a bowl-like concave surface having such a shape that the depth increases as it goes from the outer circumferential side toward the center side.

The protective layer 67 is formed so as to cover the adhesive layer 62, the wiring layer 64, and the via wiring 66 (the protrusion 66T). As the material of the protective layer 67, for example, a photosensitive epoxy-based insulating resin, an insulating acrylic resin, and so on can be used.

The flexible board 52 is similar to the above-described flexible board 51. In other words, the flexible board 52 includes a base material 61, adhesive layers 62 and 63, a wiring layer 64, via wirings 66, and a protective layer 67. The via wirings 66 are formed in through-holes 65 passing through the wiring layer 64, the adhesive layer 62, the base material 61, and the adhesive layer 63.

Further, the flexible board 52 has the via wirings 66 at both end portions. The left end of the flexible board 52 is connected to the wiring layer 33 of the rigid board 11 by the via wiring 66 formed at the left end portion. Further, the right end of the flexible board 52 is connected to the wiring layer 33 of the rigid board 12 by the via wiring 66 formed at the right end portion.

As shown in FIG. 1B, the flexible board 51 has the through-hole 65 passing through the wiring layer 64, the adhesive layer 62, the base material 61, and the adhesive layer 63. The via wiring 66 is formed in the through-hole 65. The planar shape of the through-hole 65 can be set to, for example, a circle shape.

The through-hole 65 is formed in the wiring layer 64, the adhesive layer 62, the base material 61, and the adhesive layer 63 by performing punching from the upper surface side of the flexible board 51, that is, from the wiring layer 64 with a mold or the like. Therefore, portions of the wiring layer 64, the base material 61, and the adhesive layers 62 and 63 to form the inner surface of the through-hole 65 are deformed so as to hang down from the upper side toward the lower side in FIG. 1B. In other words, the edge portion 64b of the upper surface side of the wiring layer 64 is rounded in a curved surface shape (so-called "droop" occurs in the punching direction). The adhesive layer 62, the base material 61, and the adhesive layer 63 are also deformed in the same shape as that of the wiring layer 64.

The via wiring 66 is filled in the through-hole 65 passing through the wiring layer 64 and the base material 61. The via wiring 66 has the protrusion 66T protruding from the upper surface of the wiring layer 64, and the protrusion 66T extends on the upper surface 64a of the wiring layer 64 positioned outside the through-hole 65. A portion of the via wiring 66 between the side surface 66a of a portion of the via wiring 66 filled in the through-hole 65 and the lower surface of the protrusion 66T has a curved surface shape according to the roundness ("droop") of the edge portion 64b of the wiring layer 64.

In a case of forming the via wiring 66 by electrolytic plating, the lower end of the via wiring 66 is joined with the wiring layer 33 of the rigid board 11, and the upper portion of the portion of the via wiring 66 positioned inside the through-hole 65 is joined with the wiring layer 64 of the flexible board 51. In this case, the side surface 66a of the via wiring 66 positioned inside the through-hole 65 is not in close contact with an inner surface 61a of the base material 61, but just in contacts on the inner surface.

For example, in a case of mounting a heat generating component as an electronic component on the rigid board 11, heat of the electronic component is transmitted to the rigid board 11 and the flexible board 51. The wiring layer 33 of the rigid board 11 is composed of copper or a copper alloy. Similarly, the wiring layer 64 of the flexible board 51 is composed of copper or a copper alloy. Further, the via wiring 66 is formed of a metal plated with copper or a copper alloy so as to connect the wiring layer 33 and the wiring layer 64. Therefore, the wiring layers 64 and 33 and the via wiring 66 have the same coefficient of thermal expansion (CTE). In other words, the wiring layer 33 of the rigid board 11 and the wiring layer 64 of the flexible board 51 have no difference in coefficient of thermal expansion, and thus mismatching in coefficient of thermal expansion does not occur. Therefore, cracking and the like are unlikely to occur in the via wiring 66, and thus the reliability of the connection of the rigid board 11 and the flexible board 51 improves. This is also satisfied in the relation between the rigid board 11 and the flexible board 52 and the relation between the flexible board 52 and the rigid board 12.

Also, in the flexible board 51, the base material 61 and the adhesive layers 62 and 63 expand or contract by heat applied to the flexible board 51. However, since the side surface 66a of the portion of the via wiring 66 positioned inside the through-hole 65 just is in contact on the inner surface 61a of the base material 61, stress attributable to expansion or contraction is unlikely to be transmitted to the via wiring 66, and thus clacking and the like are unlikely to occur in the via wiring 66.

Also, the through-holes 65 and the via wirings 66 of the flexible board 52 shown in FIG. 1A are formed in the same way as that of the through-hole 65 and the via wiring 66 of the flexible board 51 described above. Therefore, even in the flexible board 52, the through-holes 65 and the via wirings 66 have the same effects as those of the above-described flexible board 51.

As shown in FIG. 1B, the via wirings 66 have protrusions 66T protruding from the upper surface 64a of the wiring layer 64, and the protrusions 66T extend on portions of the upper surface 64a of the wiring layer 64 positioned outside the through-holes 65. Portions of the via wirings 66 between the side surfaces 66a of the portions of the via wirings 66 positioned inside the through-holes 65 and the lower surfaces of the protrusions 66T have a curved surface shape according to the roundness ("droop") of edge portions 64b of the wiring layer 64.

In the flexible board 51, the base material 61 and the adhesive layers 62 and 63 expand or contract by heat applied to the flexible board 51. Stress attributable to expansion or contraction in the thickness direction of the flexible board 51 is applied to the wiring layer 64 and the via wiring 66. The edge portion 64b of the upper surface of the wiring layer 64 is rounded. Therefore, stress is unlikely to be concentrated on the portion of the via wiring 66 between the portion of the via wiring 66 positioned inside the through-hole 65 and the protrusion 66T. Therefore, cracking and the like attributable to stress are unlikely to occur in the via wiring 66.

Now, a method of manufacturing the circuit board will be described.

Also, members necessary to describe the drawings are denoted by reference symbols, and members which will not be described may be shown without reference symbols. Also, for convenience of explanation, portions to be finally components of a semiconductor device will be sometimes described with the reference symbols of the final components.

First, a process of forming the flexible board 51 will be described.

In a process shown in FIG. 2A, the base material 61 is prepared. As the base material 61, a film (for example, a polyimide film) formed of an insulating resin and having a thickness of 25 μm to 30 μm is used. On the upper and lower surfaces of the base material 61, the adhesive layers 62 and 63 are formed, respectively. The adhesive layers 62 and 63 are formed of a semi-cured adhesive such as a semi-cured epoxy resin.

Figure 2B:
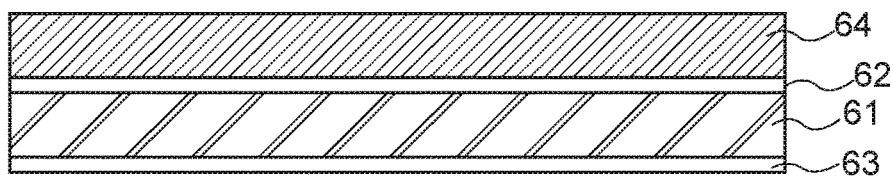

In a process shown in FIG. 2B, on the upper surface of the adhesive layer 62, a metal layer 64 is formed, and on the lower surface of the adhesive layer 63, a protective film (not shown in the drawings) is stuck. The metal layer 64 can be formed by laminating metal foil (for example, copper foil) having a thickness of 10 μm to 35 μm on the upper surface of the adhesive layer 62. As the protective film, various films such as a PET (polyethylene terephthalate) film can be used.

Alternatively, a base material having peelable protective films on the surfaces of the adhesive layers 62 and 63 may be used. In this case, from the adhesive layer 62, the protective film is peeled off. Then, on the adhesive layer 62, the metal layer 64 is formed.

Figure 2C:
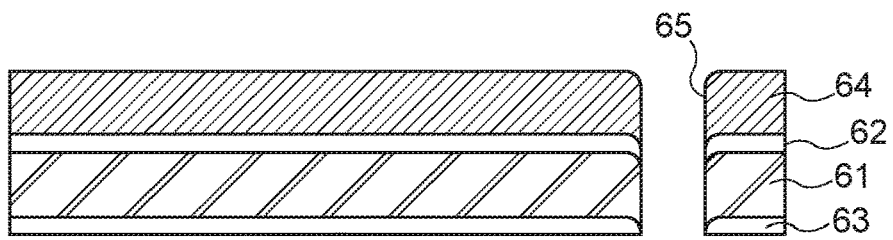

In a process shown in FIG. 2C, the through-hole 65 is formed so as to pass through the metal layer 64, the adhesive layer 62, the base material 61, the adhesive layer 63, and the protective film, by performing punching from the metal layer 64 with a mold. Thereafter, the protective film is removed.

Figure 2D:
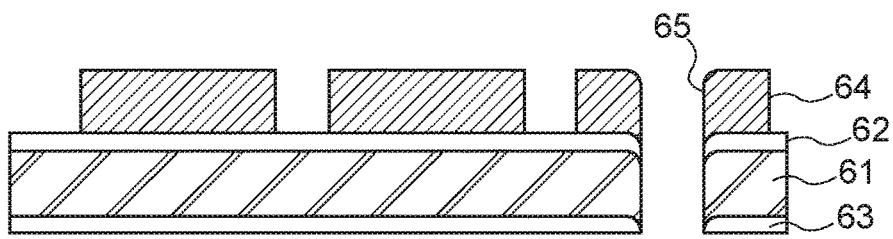

In a process shown in FIG. 2D, the metal layer 64 shown in FIG. 2C is patterned, whereby the wiring layer 64 is formed.

Specifically, first, on the upper surface of the metal layer 64 shown in FIG. 2C, an etching mask (not shown in the drawings) is formed so as to have openings at desired positions. These openings are formed on the basis of the shape of the wiring layer to be formed. At this time, the opening of the upper end of the through-hole 65 is covered by the etching mask. Similarly, the opening of the lower end of the through-hole 65 is covered by the protective film (for example, a resist film) (not shown in the drawings).

As the material of the etching mask, a photosensitive dry film resist, a liquid photoresist (for example, a dry film resist such as a novolac resin or an acrylic resin, or a liquid resist), or the like can be used. For example, on the upper surface of the metal layer 64 shown in FIG. 2C, a dry film is laminated by thermocompression, and the dry film is patterned by photolithography, whereby the etching mask is formed. Subsequently, the metal layer 64 is etched from the openings of the etching mask, whereby the wiring layer 64 shown in FIG. 2D is formed. Thereafter, the etching mask is removed, for example, with an alkaline peeling solution.

Figure 2E:
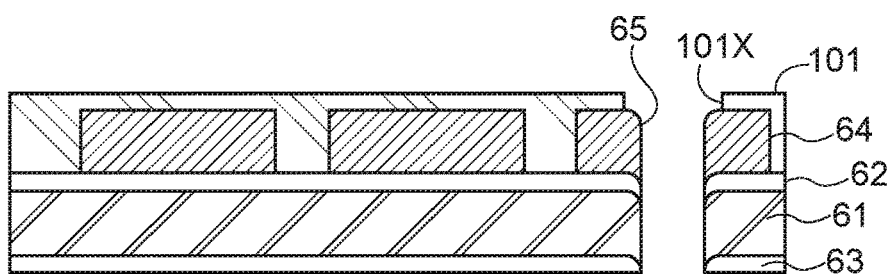

In a process shown in FIG. 2E, a plating mask 101 is formed so as to have an opening 101X at a desired position. As the material of the plating mask 101, for example, a photosensitive dry film resist (for example, a dry film resist such as a novolac resin or an acrylic resin) can be used. The opening 101X is formed at a position corresponding to the through-hole 65, in a size larger than the size (diameter) of the through-hole 65. More specifically, the opening 101X is formed according to the above-described protrusion 66T (see FIG. 1B). In other words, the opening 101X of the plating mask 101 exposes only a portion to be subjected to electrolytic plating for forming the via wiring 66 (see FIG. 1B).

Now, a process of forming the rigid board 11 will be described.

Figure 3:
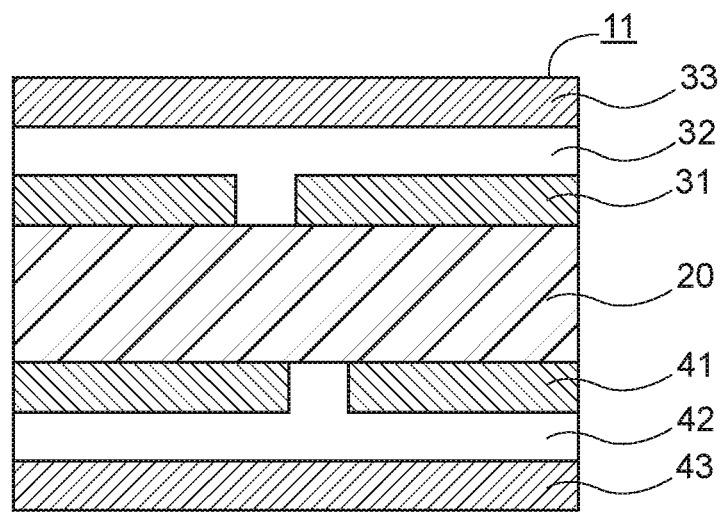
FIG. 3 is a cross-sectional view illustrating a method of manufacturing a rigid board.

In a process shown in FIG. 3, the rigid board 11 is prepared. The rigid board 11 has wiring structures formed on the upper surface and the lower surface of the core substrate 20, for example, by a buildup method.

Specifically, on the upper surface side of the core substrate 20, the wiring layer 31, the insulating layer 32, and a metal layer 33 are stacked, and on the lower surface side of the core substrate 20, the wiring layer 41, the insulating layer 42, and a metal layer 43 are stacked. The wiring layers 31 and 41 are formed by forming metal layers, for example, by electrolytic plating and patterning the metal layers. The metal layers 33 and 43 are formed in a planar shape, for example, by electrolytic plating.

Figure 4A:
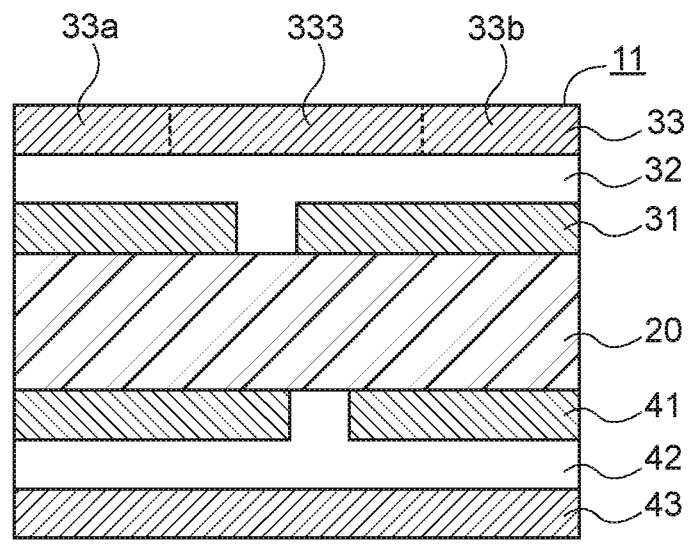
FIG. 4A is a cross-sectional view schematically illustrating the method of manufacturing the rigid board.

In a process shown in FIG. 4A, in the metal layer 33, the connection portions 33a and 33b for connection with the flexible boards are formed. For example, on the upper surface side of the metal layer 33, an etching mask (not shown in the drawings) is formed so as to have openings at desired positions. As the material of the etching mask, a photosensitive dry film resist, a liquid photoresist, or the like can be used. For example, on the upper surface side of the metal layer 33, a dry film is laminated by thermocompression, and the dry film is patterned by photolithography, whereby the above-described etching mask is formed. Subsequently, the metal layer 33 is etched from the openings of the etching mask, whereby the connection portions 33a and 33b are formed. Thereafter, the etching mask is removed, for example, with an alkaline peeling solution. Also, in this etching process, the metal layer 43 is covered by a protective film (for example, a resist film) (not shown in the drawings), thereby being protected from the etching process.

Figure 4B:
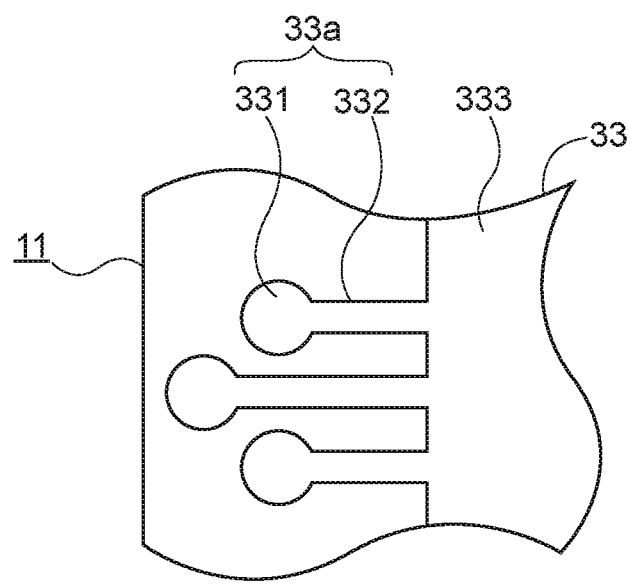
FIG. 4B is a plan view illustrating a portion of the rigid board including a connection portion.

FIG. 4B is a plan view illustrating a portion (a left end portion) of the rigid board 11 shown in FIG. 4A. As shown in FIG. 4B, the connection portion 33a has pad portions 331 formed so as to have a circle shape as seen in a plan view and be capable of being connected to a via wiring 66 (see FIG. 1B), and pattern portions 332 extending from the pad portions 331. The plurality of pattern portions 332 are connected to a planar power supply portion 333.

Figure 5:
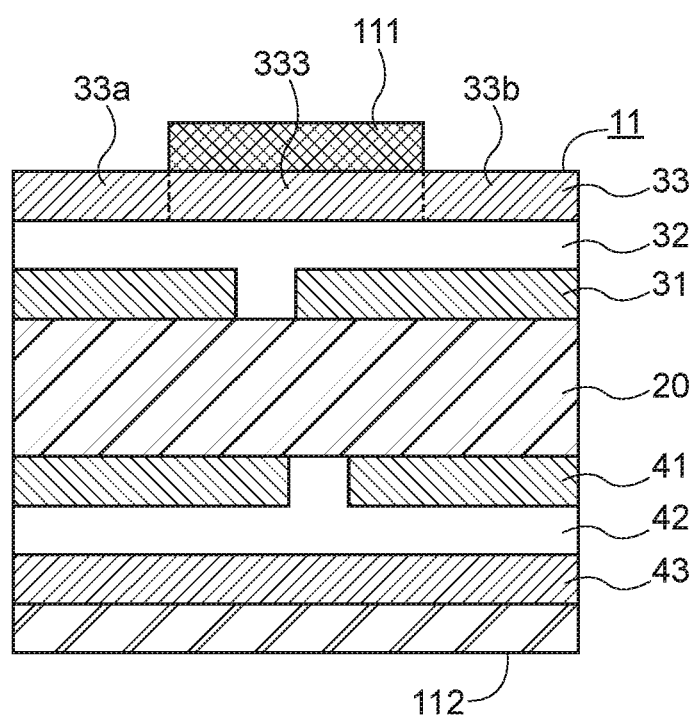
FIG. 5 is a cross-sectional view schematically illustrating the method of manufacturing the rigid board.

In a process shown in FIG. 5, on the upper surface of the metal layer 33, a plating mask 111 is formed. The plating mask 111 is formed so as to expose portions for attaching the flexible boards, and a power supply portion for electrolytic plating. In the drawings, as an example, there is shown a plating mask 111 formed so as to cover the power supply portion 333. Also, on the lower surface of the metal layer 43, a plating mask 112 is formed. The plating mask 112 is formed so as to cover the whole of the lower surface of the metal layer 43. Also, the end surfaces of the metal layers 33 and 43 are covered by resist films (not shown in the drawings). As the materials of the plating masks 111 and 112, a photosensitive dry film resist or the like can be used. For example, on the surfaces of the metal layers 33 and 43, dry films are laminated by thermocompression, and those dry films are patterned by photolithography, whereby the above-described plating masks 111 and 112 are formed.

Now, a process of forming a circuit board by connecting the flexible boards and the rigid board will be described.

Figure 6:
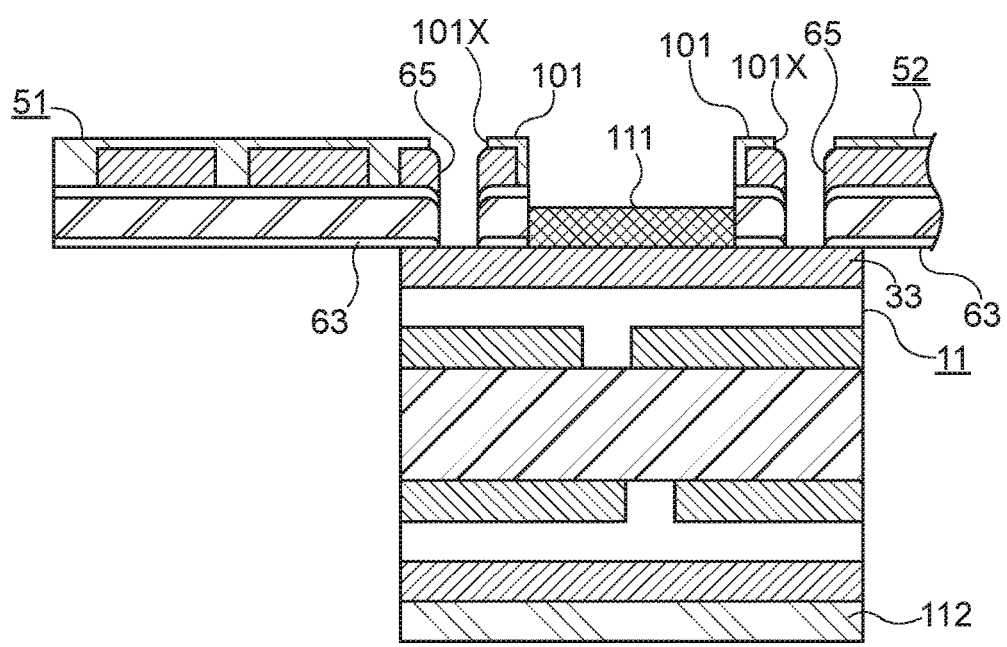
FIG. 6 is a cross-sectional view schematically illustrating a method of manufacturing a circuit board.

In a process shown in FIG. 6, on the upper surface of the rigid board 11, the flexible boards 51 and 52 are disposed. The flexible board 52 is formed in the same process as that of the flexible board 51. Subsequently, a thermal curing process is performed, whereby the flexible boards 51 and 52 are bonded to the rigid board 11 by their adhesive layers 63.

At this time, some portions of the upper surface of the metal layer 33 of the rigid board 11 are exposed from the through-holes 65 of the flexible boards 51 and 52. Such an exposed portion is the central portion of the pad portions 331 of the connection portion 33a shown in FIG. 4B.

Figure 7:
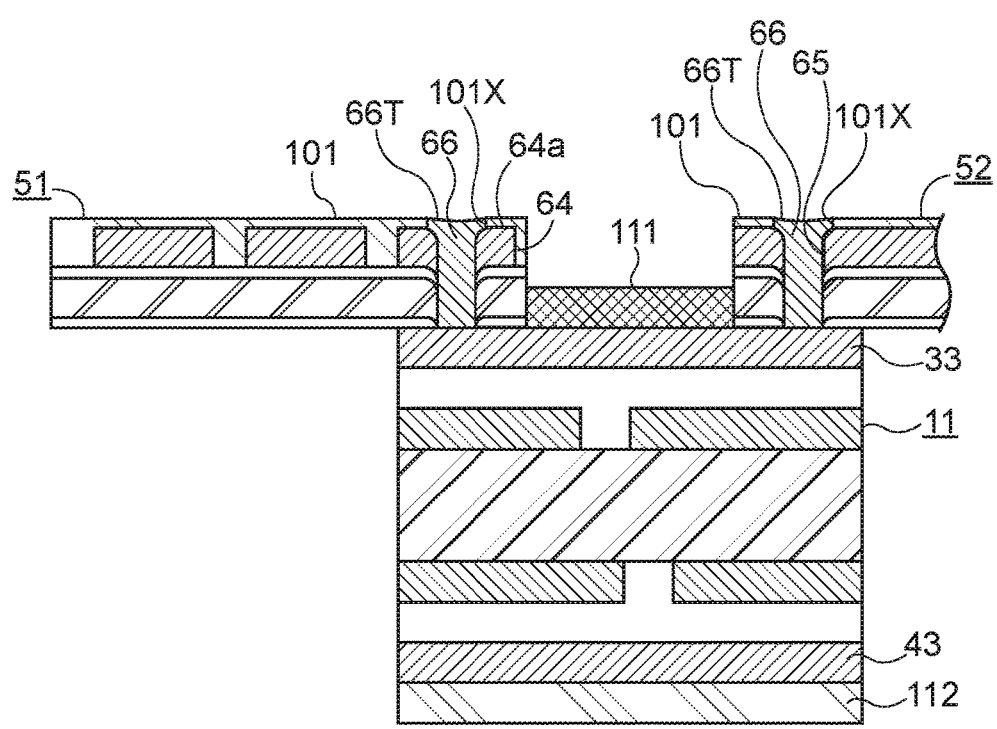
FIG. 7 is another cross-sectional view schematically illustrating the method of manufacturing the circuit board.

In a process shown in FIG. 7, the via wirings 66 are formed in the through-holes 65 by performing electrolytic plating (for example, electrolytic copper plating) using the metal layer 33 as a power supply electrode. As the material of the via wirings 66, for example, copper and the like can be used.

In this case, an electroplated film (a plated copper film) is deposited and grown from the upper surface of the metal layer 33, whereby the electroplated film is filled in the through-holes 65, whereby the metal layer 33 is connected to the wiring layer 64 by the electroplated film. Further, on the portion exposed from the opening 101X of the plating mask 101, an electroplated film is deposited and grown. As a result, the via wiring 66 having the protrusion 66T is formed. According to the size of the opening 101X, the protrusion 66T extends on the portion of the upper surface of the wiring layer 64 positioned outside the through-hole 65.

In this process, the plating masks 101 of the flexible boards 51 and 52 have the openings 101X exposing only the portions to be subjected to electrolytic plating. Therefore, it is possible to suppress the areas of the portions to be subjected to electrolytic plating, and thus it is possible to stably form the via wirings 66 by electrolytic plating. Also, it becomes possible to reduce time and electric current required for electrolytic plating.

For example, the via wirings 66 are formed by performing electrolytic plating without using the plating masks 101. In this case, if an electroplated film deposited and grown from the metal layer 33 inside the through-holes 65 starts to be connected to the wiring layer 64, the current density per unit area rapidly decreases, whereby the speed of the growth of the electroplated film remarkably decreases, and the growth becomes unstable. For this reason, the protrusions 66T may not be formed, and it may be impossible to sufficiently fill the through-holes 65. As a method of suppressing those phenomena, a method of significantly increasing electrolytic plating time, or a method of applying a high current during electrolytic plating is necessary.

In contrast with this, according to the manufacturing process of the present embodiment, since the portions exposed from the plating masks 101 are small, it is possible to suppress the current density per unit area from decreasing when the electroplated film starts to be connected to the wiring layer 64. Therefore, it is possible to suppress a reduction in the speed of the growth of the electroplated film, and thus it is possible to stably grow the electroplated film, thereby forming the via wirings 66. Further, since it is unnecessary to significantly increase electrolytic plating time or apply a high current during electrolytic plating, it becomes possible to reduce time and electric current required for electrolytic plating.

Figure 8:
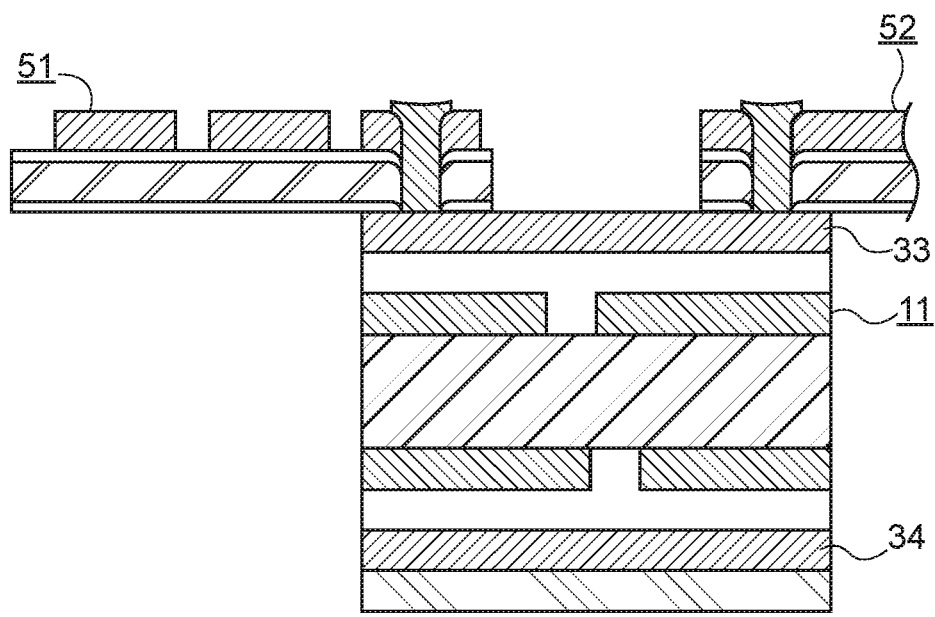
FIG. 8 is another cross-sectional view schematically illustrating the method of manufacturing the circuit board.

In a process shown in FIG. 8, the plating masks 101, 111, and 112 shown in FIG. 7 are removed, for example, with an alkaline peeling solution.

Figure 9:
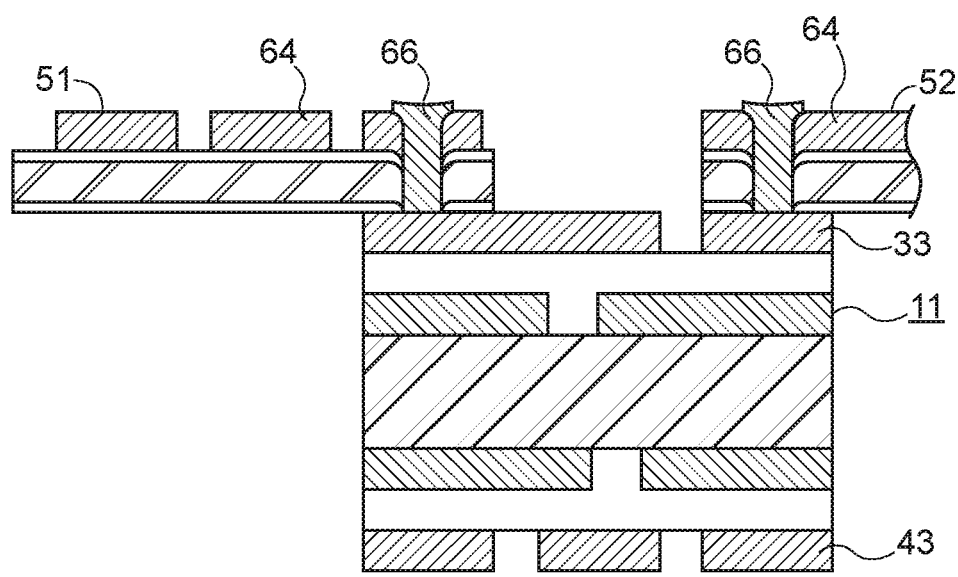
FIG. 9 is another cross-sectional view schematically illustrating the method of manufacturing the circuit board.

In a process shown in FIG. 9, the metal layers 33 and 43 shown in FIG. 8 are patterned, whereby the wiring layers 33 and 43 are formed. Also, in this process, during formation of the via wirings 66, the metal layer 33 is patterned, whereby the power supply portion (the power supply portion 333 shown in FIG. 4B) for electrolytic plating is formed. For example, on the surfaces of the metal layers 33 and 43, etching masks (not shown in the drawings) are formed so as to have openings at desired positions. As the materials of the etching masks, a photosensitive liquid photoresist and the like can be used. For example, a liquid photoresist is applied on the surfaces of the metal layers 33 and 43, and the photoresist is patterned by a direct exposing method, whereby the etching masks are formed. Subsequently, the metal layers 33 and 43 are etched from the openings of the etching masks, whereby the wiring layers 33 and 43 are formed. Thereafter, the etching mask is removed, for example, with an alkaline peeling solution. Also, in this etching process, the wiring layers 64 and the via wirings 66 of the flexible boards 51 and 52 are covered by protective films (for example, resist films) (not shown in the drawings), thereby being protected from the etching process.

Figure 10:
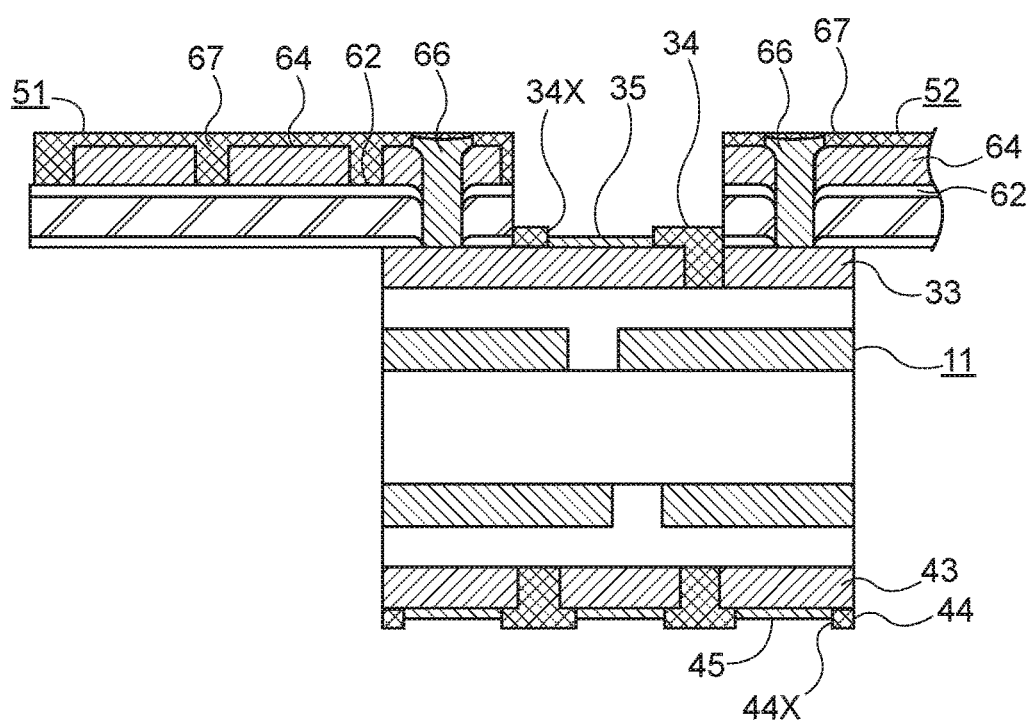
FIG. 10 is another cross-sectional view schematically illustrating the method of manufacturing the circuit board.

In a process shown in FIG. 10, the protective layers 34 and 44 and the protective layer 67 are formed. As the materials of the protective layers 34 and 44 and the protective layers 67, a photosensitive epoxy-based insulating resin, an acrylic resin, and so on can be used. For example, on the upper and lower surfaces of the rigid board 11 and the upper surfaces of the flexible boards 51 and 52, a liquid photoresist is sprayed, and that photoresist is patterned by a direct exposing method, whereby the protective layers 34 and 44 having the openings 33X and 44X and the protective layer 67 are formed.

Subsequently, on a portion of the surface of the wiring layer 33 exposed from the openings 34X of the protective layer 34, the surface treatment layer 35 is formed. Also, a portion of the surface of the wiring layer 43 exposed from the openings 44X of the protective layer 44, the surface treatment layer 45 is formed. For example, in a case where each of the surface treatment layers 35 and 45 is a stack of an Ni layer and a Au layer, on the surface of each of the wiring layers 33 and 43, a Ni layer and a Au layer are sequentially stacked, whereby the surface treatment layers 35 and 45 are formed. Also, the Ni layer and the Au layer can be formed, for example, by electroless plating.

Now, the effect of the above-described circuit board will be described.

The circuit board includes the rigid boards 11 and 12, and the flexible boards 51 and 52 connected to the rigid boards 11 and 12. The rigid boards 11 and 12 include the wiring layers 33 formed on their upper surface sides. Each of the flexible boards 51 and 52 includes the base material 61 having flexibility, and the wiring layer 64 formed on the upper surface of the base material 61 with the adhesive layer 62 interposed therebetween.

The flexible board 51 has the through-hole 65 passing through the base material 61 and the wiring layer 64, and the via wiring 66 formed in the through-hole 65. The via wiring 66 is connected to the upper surface of the wiring layer 33 of the rigid board 11. Also, the via wiring 66 has the protrusion 66T protruding from the upper surface 64a of the wiring layer 64 of the flexible board 51, and the protrusion 66T extends on a portion of the upper surface 64a of the wiring layer 64 positioned outside the through-hole 65.

In a case of forming the via wiring 66 by electrolytic plating, the lower end of the via wiring 66 is joined with the wiring layer 33 of the rigid board 11, and the upper portion of the portion of the via wiring 66 formed inside the through-hole 65 is joined with the wiring layer 64 of the flexible board 51. In this case, the side surface 66a of the via wiring 66 formed inside the through-hole 65 is not in close contact with the inner surface 61a of the base material 61, but just in contact on the inner surface. For this reason, stress attributable to bending the flexible board 51 or expansion or contraction of the flexible board 51 caused by heat is unlikely to be transmitted to the via wiring 66. Therefore, clacking and the like are unlikely to occur in the via wiring 66.

As shown in FIG. 1B, at an end portion of the through-hole 65 passing through the wiring layer 64, the edge portion 64b of the upper surface side of the wiring layer 64 is rounded. Further, the via wiring 66 filled in the through-hole 65 has the protrusion 66T extending on a portion of the upper surface of the wiring layer 64 positioned outside the through-hole 65. For this reason, stress attributable to expansion or contraction of the flexible board 51 in the thickness direction is unlikely to be concentrated on the portion of the via wiring 66 between the side surface 66a of the portion of the via wiring 66 filled in the through-hole 65 and the protrusion 66T. Therefore, clacking and the like are unlikely to occur in the via wiring 66.

For example, in a case of mounting a heat generating component as an electronic component on the rigid board 11, heat of the electronic component is transmitted to the rigid board 11 and the flexible board 51. The wiring layer 33 of the rigid board 11 is composed of copper or a copper alloy. Similarly, the wiring layer 64 of the flexible board 51 is composed of copper or a copper alloy. Further, the via wiring 66 is formed of a metal plated with copper or a copper alloy, so as to connect the wiring layer 64 and the wiring layer 33. Therefore, the wiring layers 64 and 33 and the via wiring 66 have the same coefficient of thermal expansion (CTE). In other words, the wiring layer 33 of the rigid board 11 and the wiring layer 64 of the flexible board 51 have no difference in coefficient of thermal expansion, and thus mismatching in coefficient of thermal expansion does not occur. Therefore, the reliability of the connection of the rigid board 11 and the flexible board 51 improves.

As described above, according to the present invention, the following effects are achieved.

(1) The circuit board includes the rigid boards 11 and 12, and the flexible boards 51 and 52 connected to the rigid boards 11 and 12. Each of the flexible boards 51 and 52 has the through-hole 65 formed so as to pass through the base material 61 and the wiring layer 64, and the via wiring 66 formed in the through-hole 65. The via wiring 66 is connected to the upper surface of the wiring layer 33 of the rigid board 11. Also, the via wiring 66 has the protrusion 66T protruding from the upper surface 64a of the wiring layer 64 of the flexible board 51, and the protrusion 66T extends on a portion of the upper surface 64a of the wiring layer 64 positioned outside the through-hole 65.

In a case of forming the via wiring 66 by electrolytic plating, the lower end of the via wiring 66 is joined with the wiring layer 33 of the rigid board 11, and the upper portion of the portion of the via wiring 66 formed inside the through-hole 65 is joined with the wiring layer 64 of the flexible board 51. In this case, the side surface 66a of the via wiring 66 formed inside the through-hole 65 is not in close contact with the inner surface 61a of the base material 61, but just in contact on the inner surface. For this reason, stress attributable to bending the flexible board 51 or expansion or contraction of the flexible board 51 caused by heat is unlikely to be transmitted to the via wiring 66. Therefore, cracking and the like is unlikely to occur in the through-hole 65, and thus it is possible to improve the reliability of the connection of the rigid board 11 and the flexible board 51.

(2) At an end portion of the through-hole 65 passing through the wiring layer 64, the edge portion 64b of the upper surface side of the wiring layer 64 is rounded. Further, the via wiring 66 filled in the through-hole 65 has the protrusion 66T extending on a portion of the upper surface of the wiring layer 64 positioned outside the through-hole 65. For this reason, stress attributable to expansion or contraction of the flexible board 51 in the thickness direction is unlikely to be concentrated on the portion of the via wiring 66 between the side surface 66a of the portion of the via wiring 66 filled in the through-hole 65 and the protrusion 66T. Therefore, cracking and the like is unlikely to occur in the through-hole 65, and thus it is possible to improve the reliability of the connection of the rigid board 11 and the flexible board 51.

(3) For example, in a case of mounting a heat generating component as an electronic component on the rigid board 11, heat of the electronic component is transmitted to the rigid board 11 and the flexible board 51. The wiring layer 33 of the rigid board 11 is composed of copper or a copper alloy. Similarly, the wiring layer 64 of the flexible board 51 is composed of copper or a copper alloy. Further, the via wiring 66 is formed of a metal plated with copper or a copper alloy, so as to connect the wiring layer 64 and the wiring layer 33. Therefore, the wiring layers 64 and 33 and the via wiring 66 have the same coefficient of thermal expansion (CTE). In other words, the wiring layer 33 of the rigid board 11 and the wiring layer 64 of the flexible board 51 have no difference in coefficient of thermal expansion, and thus mismatching in coefficient of thermal expansion does not occur. Therefore, it is possible to improve the reliability of the connection of the rigid board 11 and the flexible board 51.

However, the above-described embodiment may be implemented in the following embodiments.

In the above-described embodiment, the number of wiring layers or insulating layers which are included in each rigid board 11 or 12 may be appropriately changed. Also, the number of wiring layers which are included in each flexible board 51 or 52 may be appropriately changed.

In the above-described embodiment, the circuit board includes two rigid boards 11 and 12 and two flexible boards 51 and 52. However, the number of rigid boards and the number of flexible boards may be appropriately changed.

In the above-described embodiment, when the wiring layers 33 and 43 of the rigid board 11 are patterned, the wiring layers 64 of the flexible boards 51 and 52 may be patterned.

In the above-described embodiment, after the flexible boards 51 and 52 are mounted on the rigid board 11, the through-holes 65 may be formed in the flexible boards. In this case, it is possible to form the through-holes 65 with a laser device or the like.

This disclosure further encompasses various exemplary embodiments, for example, described below.

1. A method of manufacturing a circuit board, comprising:
forming a flexible board including a base material having flexibility, a second wiring layer formed on an upper surface of the base material, and a through-hole passing through the second wiring layer and the base material;
forming a rigid board having a metal layer on its upper surface side;
bonding the flexible board to an upper surface of the metal layer of the rigid board;
forming a via wiring in the through-hole by electrolytic plating using the metal layer as a power supply electrode, so as to protrude from an upper surface of the second wiring layer and have a protrusion extending on the upper surface of the second wiring layer; and
forming a first wiring layer by patterning the metal layer.

2. The method of manufacturing a circuit board according to claim 1, wherein:
the through-hole is formed by performing punching from the upper surface side of the second wiring layer, such that, at an end portion of the through-hole positioned on the upper surface side of the second wiring layer, an edge portion of the second wiring layer is rounded.

3. The method of manufacturing a circuit board according to claim 1 or 2, wherein:
in the forming the through-hole, a plating mask is formed so as to cover the second wiring layer and have an opening exposing an edge portion of the through-hole, and the via wiring is formed in the through-hole by performing electrolytic plating from the opening of the plating mask.

What is claimed is:

1. A circuit board comprising:
a rigid board including a first wiring layer formed on its upper surface side; and
a flexible board including a base material having flexibility and disposed on an upper surface side of the first wiring layer, a second wiring layer formed on the base material, and a via wiring formed in a through-hole passing through the second wiring layer and the base material,
wherein the via wiring has a protrusion protruding from an upper surface of the second wiring layer, and extending on and directly contacting the upper surface of the second wiring layer positioned on an outer circumferential side of the through-hole, and at an end portion of the through-hole positioned on a side of the protrusion of the via wiring, an edge portion of the upper surface of the second wiring layer is rounded.

2. The circuit board according to claim 1, wherein:
the flexible board includes a first adhesive layer formed on an upper surface of the base material, and a second adhesive layer formed on a lower surface of the base material,
the second wiring layer is bonded to the base material by the first adhesive layer, and the base material is bonded to the upper surface of the first wiring layer by the second adhesive layer, and
the via wiring is formed in the through-hole passing through the second wiring layer, the first adhesive layer, the base material, and the second adhesive layer, and is connected to the first wiring layer.

3. The circuit board according to claim 1, wherein:
the via wiring is made of a plated metal.

4. The circuit board according to claim 1, wherein the protrusion has a circular shape with a diameter larger than that of the through-hole, and a lower end of the protrusion is directly joined to the upper surface of the second wiring layer at a position around the through-hole.

5. The circuit board according to claim 1, wherein an upper portion of a side surface of the via wiring is directly joined with a portion of the second wiring layer which is exposed within the through-hole, the side surface of the via wiring directly contacts a portion of the flexible board which is exposed within the through-hole, and a lower end portion of the via wiring is joined directly to an upper surface of the first wiring layer.

6. The circuit board according to claim 1, wherein a portion of the via wiring disposed within the through-hole and the protrusion are integrally formed by plating metal.

7. The circuit board according to claim 1, wherein an upper surface of the protrusion is concave, with a center portion of the upper surface of the protrusion being deeper than outer circumferential sides of the upper surface of the protrusion.

* * * * *